(12) United States Patent
Jaiprakash

(10) Patent No.: US 6,589,832 B2
(45) Date of Patent: Jul. 8, 2003

(54) SPACER FORMATION IN A DEEP TRENCH MEMORY CELL

(75) Inventor: V. C. Jaiprakash, San Jose, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/053,145

(22) Filed: Jan. 17, 2002

(65) Prior Publication Data

US 2003/0060006 A1 Mar. 27, 2003

Related U.S. Application Data

(60) Provisional application No. 60/326,104, filed on Sep. 27, 2001.

(51) Int. Cl.$^7$ .......................................... H01L 21/8234

(52) U.S. Cl. ........................................ 438/206; 438/243

(58) Field of Search ................................. 438/197, 206, 438/238, 239, 242, 243, 268, 270; 257/288, 296, 301, 302

(56) References Cited

U.S. PATENT DOCUMENTS

2002/0155654 A1 * 10/2002 Dyer et al. ................. 438/206

* cited by examiner

*Primary Examiner*—Evan Pert
(74) *Attorney, Agent, or Firm*—Slater & Matsil, L.L.P.

(57) ABSTRACT

In a process for manufacturing deep trench memory cells, a method of forming a nitride spacer so as to avoid shorts resulting from poly filling voids in said nitride spacer. The voids occur because of nitride filament overhangs from the nitride pad.

9 Claims, 2 Drawing Sheets

US 6,589,832 B2

SPACER FORMATION IN A DEEP TRENCH MEMORY CELL

This patent claims the benefit of U.S. Provisional Patent Application Serial No. 60/326,104, filed on Sep. 27, 2001.

FIELD OF THE INVENTION

This invention relates generally to a trench DRAM memory cell and more specifically to a process for forming a nitride spacer used during the manufacture of the trench which avoids the formation of nitride filaments over the trench, thereby preventing the creation of shorts due to voids being filled with gate poly.

BACKGROUND OF THE INVENTION

The primary driving motivator in commercial memory cells and architecture is the desire to pack more memory capability into a smaller integrated circuit. This goal necessarily involves competing trade-offs in cost, circuit complexity, power dissipation, yield, performance, and the like. Trench capacitors are known in the art as an architecture whereby the overall size (in terms of surface area or chip "real estate") of the memory cell is reduced. The size reduction is accomplished by forming the capacitor of the memory cell in a trench.

As is known in the art, a typical DRAM cell includes a capacitor upon which is stored a charge (or no charge depending upon the cell's state) and a pass transistor, which is used to charge the capacitor during writing and in the read process to pass the charge on the capacitor to a sense amplifier.

In most recent manufacturing, planar transistors are used for the pass transistors. Such planar transistors have a critical dimension of gate length that is typically 110 nm or greater. Below that size, the transistor performance becomes degraded and is very sensitive to process tolerances. As such, for DRAM cells that are desired to be shrunk below a roughly 110 nm ground rule, existing planar transistors cannot provide the performance necessary for proper DRAM cell operation. A need exists, therefore, for a DRAM memory cell employing a pass transistor architecture that maintains acceptable performance even when shrunk to very small dimensions. Deep trench memory cells represent one approach to meet this challenge.

A method of manufacturing deep trench memory cell comprises: forming a buried plate within a semiconductor substrate, forming a deep trench having sidewalls within an active area of a semiconductor substrate, forming an oxide along the sidewalls of the deep trench, and forming a trench collar along a lower portion of the deep trench. The method further comprises filling the trench partly with polysilicon, wherein the polysilicon is outdiffused into the active area from the trench in those portions not bound by the trench collar during subsequent processing steps. The method also comprises forming a trench top oxide on the polysilicon, filling the trench with a gate polysilicon above the trench top oxide, forming a first doped region adjacent one sidewall of the trench and a second doped region adjacent another sidewall of the trench. These steps are followed by forming a contact to the gate polysilicon and connecting the gate polysilicon to a word line, and forming a contact to the first and second doped regions and connecting the first and second doped regions to a bit line.

The method also provides for forming the capacitor of the memory circuit being formed in a lower portion of a trench, and further comprises a logical pass transistor having a vertical gate formed within an upper portion of the trench, along with a source region, a drain region, and a gate with a gate oxide adjacent the source and drain regions.

SUMMARY OF THE INVENTION

Present techniques of forming a nitride spacer often produced devices with shorts resulting from nitride filament overhangs which cause voids in the spacer. The shorts occur when the spacer voids are subsequently filled with the conductive poly. According to the present invention, this problem is avoided in a process for manufacturing deep trench memory cells in a substrate covered by a pad nitride layer with a top surface and a bottom surface, and wherein the top surface in turn is covered by an oxide layer. Deep trench memory cells typically include a polysilicon gate (or sometimes referred to as a poly gate) which fills the trench to a level above a trench collar oxide. Then, according to the process steps of the invention, polysilicon (or poly) is deposited so as to cover the nitride layer and to underfill the trench so as to leave an open core extending from the top surface of the nitride layer into the trench. An oxide fill process is then used to fill the open core and cover the poly. The oxide fill and the poly it covers are then removed or etched down to the top surface of the pad nitride layer leaving an area of poly with an oxide core. The poly is then recessed and a nitride layer is deposited to form the nitride spacer. The oxide core is then stripped away to again leave an open core in the poly. The aperture or open core is then filled with a poly stud which extends from the gate poly to a level above the top surface of the pad nitride spacer. The combination structure is then subjected to a wet RTP (Rapid Thermal Processing) oxidation process to strip off the nitride layer.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The various embodiments are discussed below in detail, however, it should be appreciated that the present invention provides many applicable inventive concepts, which can be embodied in a wide variety of specific contexts. The specific embodiments discussed are merely illustrative of specific ways to make and use the invention, and do not limit the scope of the invention.

Figure 1:
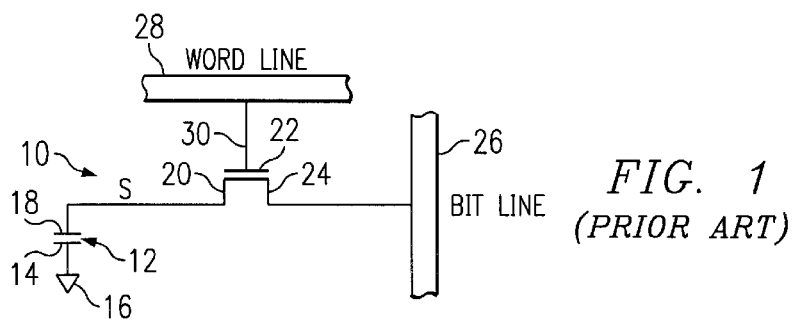
FIGS. 1 shows an electrical schematic of a memory cell.

FIG. 1 provides a schematic illustration of a typical memory cell. The cell 10 comprises a charge storage capacitor 12 having one plate 14 tied to a reference voltage 16 (typically ground as shown in FIG. 1 or half of the bitline voltage) and having its other plate 18 tied to the source 20 of pass transistor 22. Pass transistor 22 has its drain 24 tied to bit line 26 and its tied to word line 28, as is well known in the art. As will be described in greater detail below, in the preferred embodiments of the present invention, charge storage capacitor 12 is formed within a deep trench as is the source region for the pass transistor. Additionally, and as will be discussed, the gate 30 of pass transistor is formed within the upper region of the deep trench, above the trench top oxide (TTO).

Figure 2A:
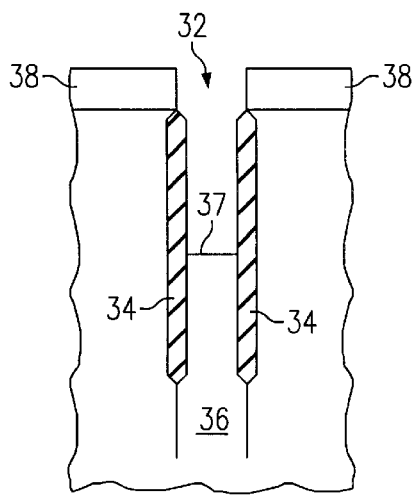
FIGS. 2A through 2C illustrate process steps in fabricating an embodiment of a memory cell.
Figure 2B:
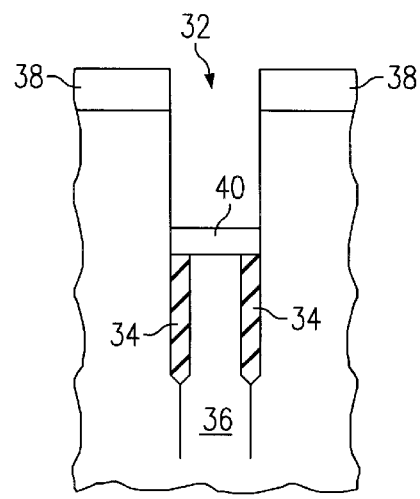

A preferred embodiment process flow for forming the above described memory cell according to the teachings of this invention is discussed with reference to FIGS. 2a through 2c and FIGS. 4a and 4e. In FIG. 2a, a deep trench 32 has been formed, trench collar oxide 34 has been formed and the trench has been filled with polysilicon 36 and the polysilicon 36 has been recessed back to a desired level 37 within the trench, all as is well known in the art. Nitride layer 38 protects the surrounding silicon during the etch step for recessing the polysilicon. As shown in FIG. 2b, the trench collar oxide has also been etched or recessed back, preferably using a wet etch technique. The oxide recess will typically result in a divot (not shown) where the collar oxide 34 is removed below the level of polysilicon fill 36. An optional thin oxidation or nitridation can also be performed. The divot is filled in by re-filling the trench with polysilicon 40 and recessing the polysilicon 40 to the desired level, as shown. This polysilicon 40 can be either slightly doped or undoped poly and is preferably recessed or etched using a standard RIE (Reactive Ion Etch) or wet etch technique. This polysilicon region 40 may also be subsequently doped in high temperature steps by polysilicon 36 and out-diffuse to form a buried strap region (not shown).

Figure 2C:
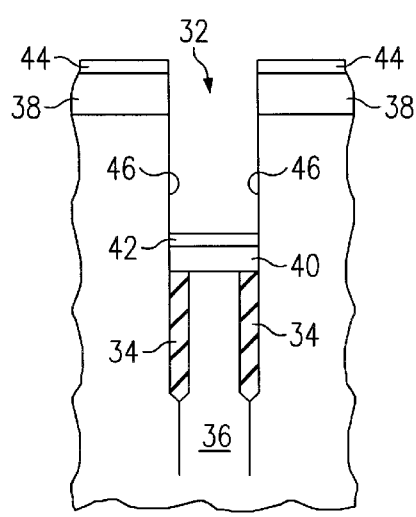

The formation of the TTO (trench top oxide) 42 is now described with reference to FIG. 2c. This is accomplished by first forming a sacrificial oxide layer (not shown) on the sidewalls of the deep trench 32 (above the region of polysilicon 40). A trench top oxide layer is then formed on the horizontal surfaces 42 and 44 using an HDP (High Density Plasma) process with a wet etch back. One skilled in the art will recognize that the HDP oxide deposition fills in from the bottom to the top in contrast to conformal deposition, where the oxide layer thickness is deposited uniformly. The HDP is deposited and then etched back by a wet chemistry. Due to the fact that the HDP oxide deposition covers the horizontal regions with a thicker deposition than the sidewalls, the sidewalls can be subsequently cleaned without etching away the oxide on the horizontal areas. Preferably the resulting oxide layer (42 and 44) thickness is around 30 nm. Optionally, a nitride wet etch can be performed to remove the overhang of the nitride layer 38 in the trench 32. After formation of the TTO layer 42, the sacrificial oxide layer is removed, thus providing a clean deep trench sidewall surface for subsequent growing of the gate oxide 46.

Figure 3:
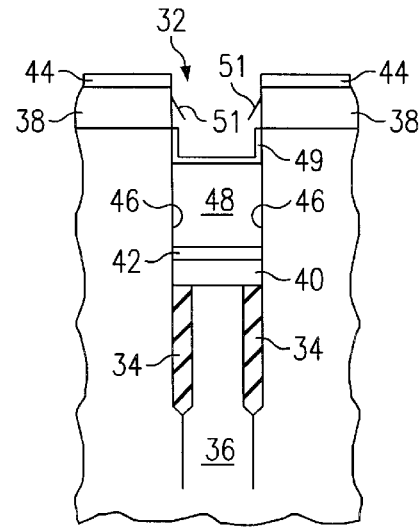
FIG. 3 illustrates the step of etching deposited gate polysilicon below the top surface of the pad nitride layer and the top surface of the bulk polysilicon which often leaves nitride filament overhangs which prevented proper deposition of the nitride spacer.

To this point in the manufacturing process, it will be appreciated by those skilled in the art that the earlier used process and the process of this invention may be the same. However, referring now to FIG. 3, there is illustrated an earlier used process wherein after gate oxide 46 has been formed, gate polysilicon 48 is deposited within the deep trench, polished by CMP and recessed. The deep trench is then typically overfilled with gate polysilicon followed by a chemical mechanical polish (CMP) to the top of nitride layer 38 or oxide layer 44. The polysilicon 48 is then etched to a level 49 below the surface of the bulk silicon surrounding deep trench 32.

Unfortunately, according to this earlier method, the above-described process partially oxides the vertical sidewalls of the pad nitride layer 38 and sometimes leaves a filament 51 overhanging trench 32. Such an overhanging filament 51 often results in voids in subsequent deposits of nitride which are used to form the nitride spacer as discussed hereinafter. Any void that exists in the nitride spacer would then be filled with polysilicon causing shorts when the poly is deposited to form a poly stud extending to the top of the trench.

Figure 4A:
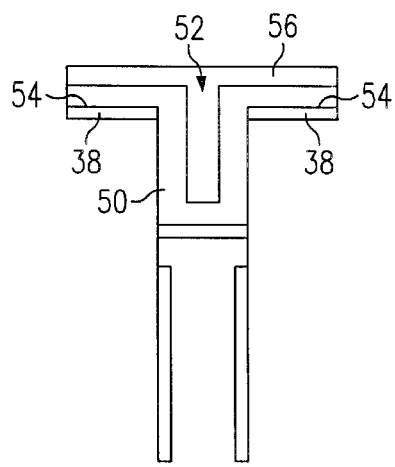
FIGS. 4A through 4E illustrate the process steps of the present invention which avoids shorts in the nitride spacer.
Figure 4B:
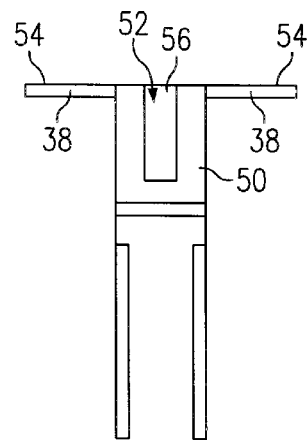
Figure 4C:
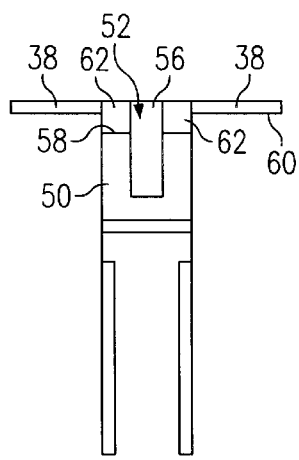
Figure 4D:
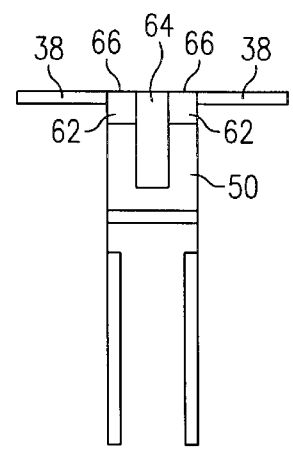

The problem of creating shorts due to poly filling voids in the nitride spacer is overcome by the process of this invention which is further illustrated with respect to FIGS. 4A through 4E. As shown in FIG. 4A, rather than depositing the gate polysilicon 48, polishing (CMP) and recessing or etching according to the earlier method which tended to create the nitride filament overhang 51, trench 32 is underfilled with gate poly 50 according to the present invention as shown in FIG. 4A. Underfilling trench 32 with poly 50 occurs after formation of gate oxide 46 as shown in FIG. 2C such that an open core or aperture 52 remains as shown in FIG. 4A. Also as shown, the poly 50 covers the top surface 54 of nitride layer 38. The poly 50 in trench 32 and covering the pad nitride layer 38 then receives an oxide fill which fills the core aperture 52 with oxide 56 and also provides a layer of oxide over the top surface of the poly 50 which lies outside of the trench 32. The oxide fill step is then followed by a CMP (chemical mill process) of the oxide 56 and the poly 50 down to the top surface 54 of the nitride layer 38 as shown in FIG. 4B. The polysilicon 50 is then etched or recessed to a level 58 below the surface 60 of the bulk polysilicon. The amount of recess is a matter of design choice provided that the recess is within the junction depth of the drain region so as to ensure that there is no overlap of the junction and the gate and is typically on the order of 70 nm. A CVD deposition process or other suitable process may then be used to deposit nitride and achieve a nitride recess or divot fill shown in FIG. 4C. The nitride divot fill forming nitride spacer 62 is then followed by an oxide strip to remove the oxide 56 in core 52. Then as shown in FIG. 4D, the aperture or divot left after stripping the oxide is filled with poly. This forms a poly stud 64 which extends from the gate poly 50 past top surface 66 of nitride spacer 62. The poly stud 64 preferably becomes integral with the previously deposited poly 50.

At this point in the process, it will be appreciated that the pad nitride layer 38 must eventually be removed. To accomplish this, the active area may be patterned, such as for example, by a photoresist to protect the nitride spacer and poly stud 64. The patterning is then followed by an oxidation process of the unprotected AA (active area) forming an oxide layer (not shown). An ISSG RTP oxidation process may be used to form the oxide layer.

Formation of the oxide layer is then typically followed by a wet etch to remove the oxide layer. The poly silicon stud 64 is then touched up by an HDP (High Density Plasma) fill and planarization process.

Figure 4E:
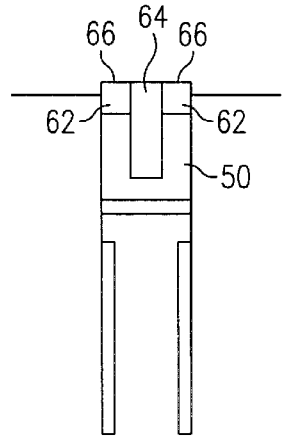

Finally, the nitride pad 38 is stripped away according to one or more processes well known to those skilled in the art, and if necessary, another nitride divot fill is performed on nitride spacer 62 resulting in the structure shown in FIG. 4E.

It will also be appreciated that to protect the side of the spacer cut by the AA trenches, an oxide is needed on the surface. This can be accomplished by using the ISSG RTP oxidation process, mentioned above, to form a nitride oxide on the open spacer surface. As will be appreciate by those skilled in the art, such a nitride oxide surface offers significant protection against the process of stripping the pad nitride, and also results in a very slow etch rate from a BHF wet etch.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For instance, exemplary insulative materials have been disclosed, such as oxide and nitride, although in some instances these materials can be substituted for each other, or other insulative materials could be employed. Conductive materials have also been disclosed, but it is within the scope of the present invention to employ other combinations of the disclosed or other conductive materials, such as now commonly employed in the art or subsequently developed. Certain spacings and dimensions have been disclosed regarding the currently contemplated best mode of the invention. These dimensions are not intended to be limiting in any manner and the present invention contemplates larger or smaller devices. Additionally, the present teaching may be applicable to other semiconductor materials and process, such as Germanium, Gallium-Arsenide, other III-IV materials, or other semiconductor materials. Other etch processes than specifically described above are within the scope of the present invention, including reactive ion etching (RIE), wet etching, dry etching, plasma etching, and the like. Likewise, the deposition techniques described herein are exemplary, rather than limiting and the present invention is broad enough to include other deposition techniques such as CVD, PVD, PEVD, thermal oxidation, and the like. It is intended that the appended claims encompass any such modifications or embodiments.

What is claimed is:

1. A process for manufacturing at least one memory cell in a substrate defining a deep trench, said substrate covered by a pad nitride layer with a bottom surface and a top surface having a layer of oxide covering said top surface, said deep trench filled with poly to a level above a trench collar oxide, said process comprising the further steps of:

depositing gate poly to cover said pad nitride layer and to underfill said trench thereby leaving an open core in said gate poly extending from a top surface of said nitride layer into said trench;

providing an oxide fill to fill said open core and cover said poly;

removing said oxide fill and said poly down to said top surface of said pad nitride layer leaving an area of poly with an oxide core;

recessing said area of poly;

depositing nitride to fill said poly recess and form a nitride spacer;

stripping said oxide core leaving an open core in said poly area; and filling said open core with a poly stud extending from said gate poly to a level above the top surface of said nitride spacer.

2. The process of claim 1 and further comprising the step of forming a patterned layer of photoresist to protect said nitride spacer and said poly stud.

3. The process of claim 2 further comprising forming a layer of nitride oxide on said nitride layer by an ISSG RTP oxidation process.

4. The process of claim 1 and further comprising the step of filling any divots in said nitride spacer.

5. The process of claim 1 herein said step of removing said oxide fill and said poly comprises the steps of over filling said aperture with poly and then planarizing said oxide and said poly back to said nitride layer by CMP (chemical mechanical polishing).

6. The process of claim 1 further comprising the step of removing said pad nitride layer.

7. The process of claim 6 further comprising the step of removing said layer of nitride oxide with a wet etch process.

8. The process of claim 7 further comprising the step of touching up said poly stud with an HDP fill and planarization process.

9. The process of claim 8 and further comprising the step of filling any divots in said nitride spacer after said removing step.

* * * * *